US006016023A

United States Patent [19]

Nilsson et al.

[11] Patent Number: 6,016,023

[45] Date of Patent: Jan. 18, 2000

[54] TUBULAR ULTRASONIC TRANSDUCER

[75] Inventors: Bo Nilsson, Öregrund; Håkan Dahlberg, Långbackavägen, both of Sweden

[73] Assignee: Ultra Sonus AB, Oregrund, Sweden

[21] Appl. No.: 09/075,833

[22] Filed: May 12, 1998

[51] Int. Cl.[7] .................... H01L 41/04

[52] U.S. Cl. .................... 310/341; 310/342; 310/346; 310/334

[58] Field of Search .................... 310/334, 341, 310/342, 346

[56] References Cited

U.S. PATENT DOCUMENTS

| | | | |
|---|---|---|---|
| 1,874,980 | 8/1932 | Hansell | 310/346 |
| 3,740,508 | 6/1973 | Olsen et al. | 218/67 |
| 4,011,474 | 3/1977 | O'Neill | 310/328 |
| 4,220,887 | 9/1980 | Kompanek | 310/334 |
| 4,374,477 | 2/1983 | Kikuchi et al. | 73/861.18 |
| 5,225,734 | 7/1993 | Nakanishi | 310/323 |
| 5,364,960 | 11/1994 | Marcotullio et al. | 562/121 |

FOREIGN PATENT DOCUMENTS

| | | |
|---|---|---|
| 0251797 | 7/1988 | European Pat. Off. . |
| 1266143 | 8/1977 | United Kingdom . |

*Primary Examiner*—Nestor Ramirez
*Assistant Examiner*—Peter Medley
*Attorney, Agent, or Firm*—Young & Thompson

[57] ABSTRACT

A method to improve the high output characteristics of an ultrasonic transducer by urging a cooling gas 13 to flow through the transducer, thereby passing a cooling member 3 at the inner radius of at least one piezoelectric element 6 surrounding a central fluid conduit 21. In a preferred embodiment sulfurhexafluoride ($SF_6$) is used as cooling gas.

10 Claims, 2 Drawing Sheets

TUBULAR ULTRASONIC TRANSDUCER

TECHNICAL FIELD OF THE INVENTION

The present invention relates to ultrasonic transducers, and more specifically to high power ultrasonic transducers having tubular piezoelectric elements for radial vibration.

PRIOR ART

Ultrasonic transducers sometimes have to be utilized under conditions of an environment having reduced thermal conductivity. For example, this is the case for submersible transducers, as well as for transducers working in surroundings of high temperatures.

Regardless of design of transducer, a high ambient temperature constitutes an environment of reduced thermal conductivity. The heat generated by the piezoelectric elements of the transducer tends to build up a high intrinsic temperature within the transducer, rather than the heat being transferred to the surroundings.

In a submersible ultrasonic transducer the heat is captured within the transducer. The casing of a submersible transducer is sealed for the transducer to be operative under water, thereby making the removal of excess heat from the transducer difficult. Numerous submersible transducers are known within the art. For example, the British patent 1 266 143 to H. J. Wollaston discloses an ultrasonic transducer wherein the oscillating piezoelectric element of a transducer is contained within a casing of tubular form.

Also conventional surface mounted transducers, for instance on the outside of a tank wall, often have to be encased and sealed to withstand harsh industrial environment, and consequently a similar situation as for submersible transducers occurs.

Thus, encasing the piezoelectric elements of a transducer will reduce the thermal conductivity between the piezoelectric element or elements and the medium surrounding the transducer, thereby reducing the cooling of the piezoelectric element(s). The temperature increase in the piezoelectric material will decrease its electromechanical efficiency and finally—typically at a temperature of about 608° F. (320° C.)—the material will depolarize and become useless.

This is especially pronounced in the case of high power transducers, wherein the higher power applied can generate considerable internal heat in the piezoelectric elements as well as in the encasement of the transducer, especially if the total resonance system does not have a proper acoustical and electrical tuning.

In addition, the lifetime of a high power ultrasonic transducer is also reduced by phenomena such as corona discharge and arc over, between edges of piezoelectric elements and other electrically conductive parts of the transducer. If any organic material is present corona discharges will produce conductive carbon layers, and when the distance between different electrical polarities diminish, an arc over will appear. Arcs deteriorate the piezoelectric material. Although these phenomena are not limited to encased transducers only, the occurrence of arcs is still a disadvantage in addition to the degeneration caused by high temperature.

The conventional way to reduce the arc effect has been to immerse the stack of piezoelectric elements in an insulating medium, but this has also the effect to further reduce the thermal conductivity between the piezoelectric elements and the surrounding of the transducer.

In U.S. Pat. No. 4,011,474, C. G. O'Neill discloses a transducer, having flat piezoelectric elements stacked upon each other, with improved characteristics in this respect, the improvement being that a dielectric medium is applied with pressure to the radial ends of disk shaped piezoelectric elements. The dielectric medium may be a solid material or a fluid, preferably a liquid.

Although a dielectric medium applied with pressure to the piezoelectric elements, as described in U.S. Pat. No. 4,011,474, reduces the occurrence of degrading arcs, the problem of low thermal conductivity remains.

Ultrasonic transducers with at least one piezoelectric element of tubular shape, or a plurality of piezoelectric elements circumferentially disposed around a central axis, for vibrating in radial direction with respect to the central axis form a specific group of ultrasonic tranducers, herein named tubular ultrasonic transducers. Examples of tubular ultrasonic transducers are described in, for example, U.S. Pat. No. 4,220,887 to Kompanek and EP 0 251 797 to Inoue and Konno.

The disadvantages described above are also valid for tubular ultrasonic transducers.

SUMMARY OF THE INVENTION

It is an object of the present invention to provide a tubular ultrasonic transducer for generating high power ultrasonic vibrations with improved efficiency.

This object is achieved by a method according to claim 1 of the appended claims, wherein is defined a method for cooling the piezoelectric elements of the tubular transducer by the flow of a coolant.

In a preferred embodiment of the invention, the coolant is a gas with the ability to suppress the corona and arc phenomena. In a most preferred embodiment the gas has sulfurhexafluoride $SF_6$ as a main component.

In a second aspect of the invention is provided an ultrasonic transducer device according to claim 5, wherein is defined a design for an ultrasonic transducer device for use with the method of the invention.

BRIEF DESCRIPTION OF THE DRAWINGS

An ultrasonic transducer device for use with the method according to the invention will be described, by way of an example only, with reference to the attached drawings, wherein.

DETAILED DESCRIPTION OF EMBODIMENTS

The temperature of piezoelectric elements in an ultrasonic transducer will increase during operation because of the friction within the piezoelectric materials and also because acoustic energy is trapped inside the transducer, especially if the transducer system is not properly tuned. Therefore, it becomes obvious that the piezoelectric material can only transmit ultrasonic energy at a level that allows the material to work at a temperature so low, that it can maintain its effective properties during its useful lifetime.

According to the present invention, a method that allows an ultrasonic transducer having at least one piezoelectric element arranged around a central axis for vibration in a radial direction with respect to the central axis to transmit ultrasonic energy at a raised level by way of cooling the at least one piezoelectric element includes the steps of:

providing the transducer with at least one gas inlet and at least one gas outlet;

providing a gas conducting means in contact with each piezoelectric element;

selecting a cooling gas; and by utilizing an external pressure source urge said cooling gas to flow through the gas connecting means thereby cooling the adjacent piezoelectric element or elements.

A preferred embodiment of a tubular ultrasonic transducer for transmitting ultrasonic energy into a central fluid-containing tube, and for use with the method of the invention, shall now be described with reference to FIG. 1 and 2.

Figure 1:
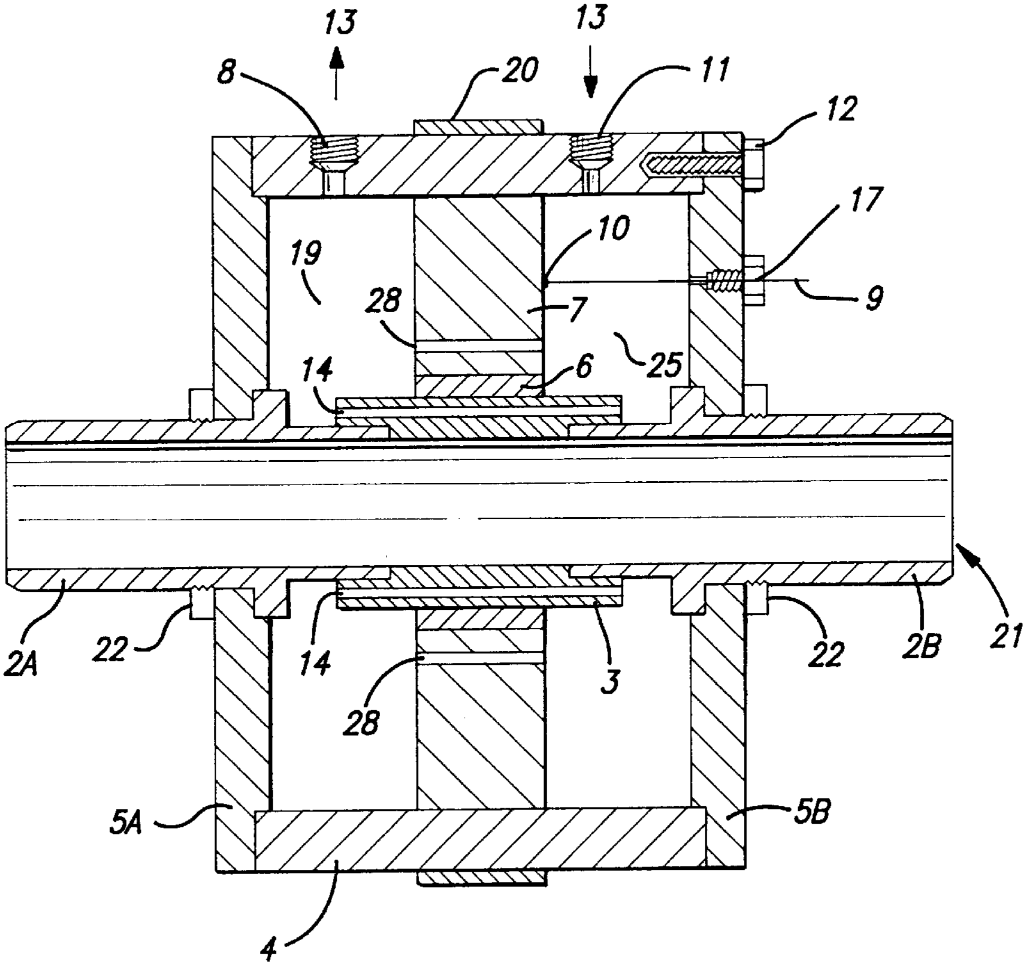
FIG. 1 is a cross-sectional side elevation view of an embodiment of a transducer according to the invention.

According to FIG. 1, the tubular ultrasonic transducer includes a housing cylinder 4 being on each side sealed by a circular end plate 5A, 5B fastened to the housing cylinder by bolts 12 (one showed only).

A central fluid conduit 21, for transportation of a fluid to which ultrasonic energy shall be transmitted, is disposed within the cylinder housing and runs through central holes in the end plates 5A, 5B. The central fluid conduit is assembled by two attachment pipes 2A, 2B, one on each side, inserted with metal to metal contact into a central sleeve section 3 to form the central fluid conduit 21. Each attachment pipe runs through the central hole of each end plate, respectively, an is secured to the end plate by a nut 22 threaded on an outer thread provided at the attachment pipe.

Figure 2:
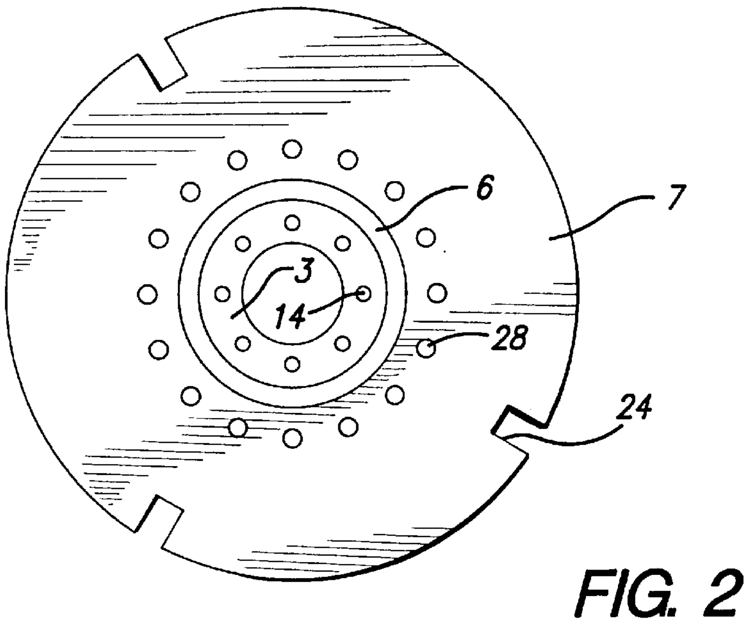
FIG. 2 is a front elevation view of a first embodiment of an aggregate of a piezoelectric element surrounded by cooling elements.

With reference to FIG. 1 and 2, the sleeve 3 is provided with channels 14 running axially between the outer and inner barrel surfaces of the sleeve, thereby connecting one end surface of the sleeve with the other, in order to serve as a gas conducting means.

The sleeve 3 is tightly inserted into the central hole of a hollow cylindrically shaped piezoelectric element 6. The piezoelectric element 6 is in a corresponding manner inserted into the central hole of a thick walled metal tube 7. In order to achieve a proper pre-stress of the piezoelectric element, the need for which is well known within the art, as well as to achieve a good thermal contact the metal tube 7, the piezoelectric element 6 and the sleeve 3 are thermally shrinked together.

Channels 28 are provided axially through thick walled metal tube 7.

Figure 3:
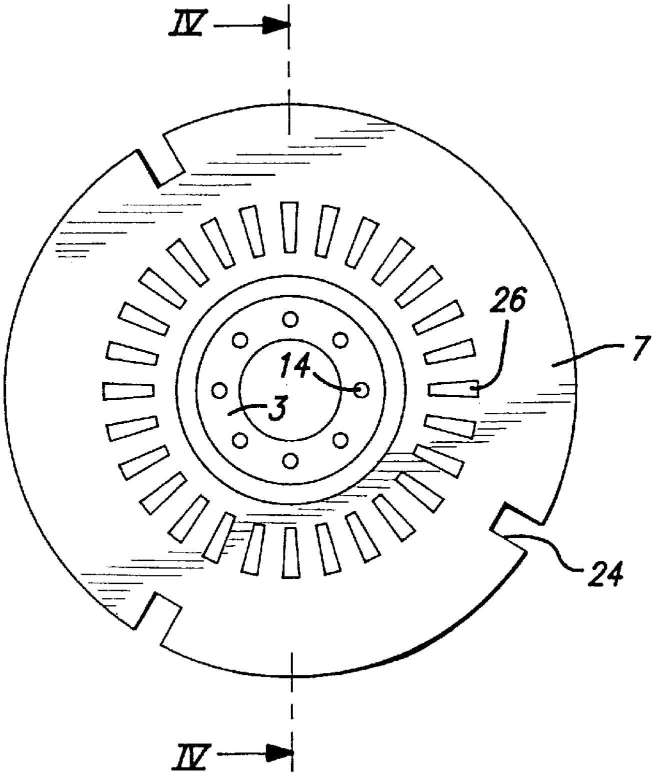
FIG. 3 is a front elevation view of a second embodiment of an aggregate of a piezoelectric element surrounded by cooling elements.

The outer diameter of the thick walled metal tube 7 is selected such that it fits snugly within the inner diameter of the housing cylinder 4. Grooves 24 are provided at slightly irregular distances around the outer diameter of the tube 7 in order to avoid ring resonances within the tube. In FIG. 2 and 3, three such grooves being partitioned by 90°, 120° and 150°, respectively, are shown. On the outside of the cylinder, immediately above the thick walled metal tube, is a metal band 20 wrapped and tightened to provide good acoustical contact between the metal tube 7 and the housing cylinder. The metal band 20 also acts as an acoustic reflector.

The material of the housing cylinder 4 and the end plates 5A, 5B can be selected among any suitable electrically isolating material, such as acrylic plastic. The metal parts are preferably made from stainless steel. The material of the piezoelectric element 6 may be any suitable ceramic material as is well known within the art, such as leadzirconate titanate (PZT), lead titanate (PT), lead metaniobate and bismut titanate.

The thick walled metal tube 7 is electrically connected, for example by a welded joint 10, to a metal rod 9. The rod is passing an end plate 5B through a sealed opening 17 to be connected to an external control and power unit (not shown). A ground potential is provided to the central fluid conduit 21 by any conventional means, such as a connecting cable (not shown) welded to one of the attachment pipes 2A, 2B. The external control and power unit therefore can be used to vibrate the piezoelectric element 6 in a radial direction with respect to the central axis of the central fluid conduit, thereby transmitting ultrasonic energy into a fluid in the central fluid conduit 21.

Through the housing cylinder 4 is provided at least one gas inlet 11 and at least one gas outlet 8, such that the gas inlet and the gas outlet are separated by the thick walled metal tube 7. The gas inlet opens into an inlet chamber 25 between the metal tube 7 and the right (when viewing FIG. 1) end plate 5B, while the gas outlet connects a corresponding outlet chamber 19 on the other side of the metal tube 7 to the outside of the housing cylinder.

The channels 14 in the sleeve 3 and the channels 28 in the thick walled metal tube 7 provide a flow path for gas from the inlet chamber 25 to the outlet chamber 19. Therefore, when urging a cooling gas through the channel 14, the sleeve as well as the thick walled metal tube act as cooling members for the piezoelectric element 6.

A suitable tubing can be attached to the gas inlet orifice 11 in order to connect to a suitable, conventional gas and pressure source (not shown). Thus, during operation a cooling gas 13 is, by applying a proper pressure preferably within the range of 3 psi to 30 psi, introduced through the gas inlet orifice 11 into the inlet chamber 25 and therefrom through the channels 14 of the sleeve 3 and the channels 28 of the thick walled metal tube, thereby receiving heat from the piezoelectric element 6, into the outlet chamber 19 and is finally discharged through the gas outlet opening 8. Thus, internal heat in the piezoelectric element is transported from the inside of the transducer to the outside in a controlled way.

Preferably, the outlet opening 8 is connected by tubing to a heat exchange device to cool the gas to enable it to be circulated through the transducer in a closed circulation system. However, since this arrangement is optional, could be realized with any suitable conventional equipment known by those skilled in the art, and further is outside of the novel aspect of the invention, such a closed circulating system is not illustrated in FIG. 1.

In operation, the control and power unit provides an alternating voltage of a level and frequency selected to suit the application at hand to the piezoelectric elements 6, such as a peak-to-peak voltage of 10 000 volts at a frequency of 30 kHz, thus bringing it to vibrate radially in a manner well known within the art.

At the same time, the gas 13 is forced by the gas and pressure source to flow through the sleeve 3 and the metal tube 7 to cool the piezoelectric element 6 and thereby keep it at a low and efficient working temperature.

Figure 4:
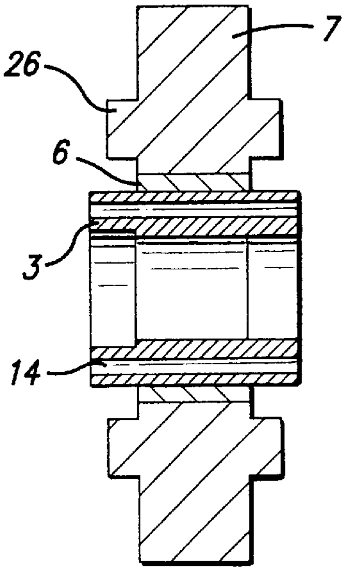
FIG. 4 is a cross-sectional side elevation view of the aggregate according to FIG. 3.

In a second alternative embodiment, shown in FIG. 3 and 4, the cooling channels 28 in the thick walled metal tube 7 are replaced by cooling flanges 26 protruding out from thick walled metal tube. This second embodiment the gas differs from the first embodiment in that the heat induced in the thick walled metal tube is carried away via the cooling flanges 26 in stead of via the channels 28.

An ultrasonic transducer according to the invention is able to convert a higher ratio of the applied voltage to ultrasonic energy compared to a similar conventional transducer due to the system for cooling the at least one piezoelectric element within the transducer. This cooling also enables the piezoelectric element to withstand higher applied voltage than would be possible without the cooling, thus raising the efficiency and the lifetime of the transducer. It is also possible to use a transducer according to the present invention in higher ambient temperatures than is possible with a conventional transducer.

It should be noted that the dimensions of the components, as well as of the assembled transducer, have to be selected to suit the application at hand. Thus, the transducer should be dimensioned according to common principles valid for transducer systems, and preferably be tuned to work at acoustical and electrical resonance in order to give highest possible output efficiency.

It should further be noted that although the preferred embodiment of a tubular ultrasonic transducer according to the present invention, as shown in FIG. 1, includes one tubular piezoelectric element only, the scope of the invention also includes embodiments with more than one tubular piezoelectric element concentrically disposed outside of each other, and with cooling members between each adjacent piezoelectric element. Also within the scope of the present invention are embodiments with more than one tubular piezoelectric element disposed around the central fluid conduit, but spaced axially with regard to the central axis of the tubular transducer. Further within the scope of the present invention is embodiments wherein a plurality of piezoelectric elements are disposed around the central fluid conduit and radially spaced apart.

Numerous gases could be utilized for the purpose of cooling the at least one piezoelectric element, though a general requirement is that the gas has to be sufficiently inert not to damage any parts of the transducer. Further, it should have good thermal conductivity properties.

Therefore, suitable gases include nitrogen, hydrogen, carbon dioxide, Freon 12 and ammonia.

However, the most preferred gas to be used with the cooling system of the invention is sulfurhexafluoride, $SF_6$.

$SF_6$ has excellent thermal capacity $c_p$ which, for example, is in the order of two to three times higher than any of the other gases mentioned above.

Further, $SF_6$ is also an excellent dielectricum. This property of $SF_6$ could be advantageously utilized in a transducer according to the invention, since it has a reducing effect on the arc phenomena occurring at high electromagnetic field intensities as present near the edges of the at least one piezoelectric element.

It should be pointed out that since the present invention makes it possible to utilize higher electrical voltages than for a similar conventional transducer, the distances between parts of different electrical potential should normally be extended, as compared to conventional transducers, to avoid arc over. The use of $SF_6$ gas reduces, or may even eliminate, this need for increased distances. However, for safety reasons there should be installed an automatic electricity cut off system to, if the gas pressure becomes too low in the circulation system, avoid short circuits or other electric hazards.

Although $SF_6$ is the most preferred gas to be used with the present invention, it should be noted that $SF_6$ also has some less pleasant characteristics which have to be considered when designing a transducer for the application at hand.

Thus, it is known that under the influence of very strong electric fields, typically more than 100 000 volts, $SF_6$ can interact with a variety of compounds, including moisture, to produce gases and ions that finally degrade and destroy a high voltage device. It is therefore essential that high voltage devices contain little or no degradable compounds such as phenolic resins, glass, glass reinforced materials or porcelain near the high voltage fields in the $SF_6$ atmosphere. Since a high voltage piezoelectric transducer normally operates at voltages below 20 000 V, it is clear that $SF_6$ can be used to suppress corona discharge and the like in such a transducer.

Also, $SF_6$ is an environmental hazard. Specifically, it has been classed as a potent greenhouse gas by scientists on the Intergovernmental Panel on Climate Change. Therefore, care must be taken that it does not escape to the atmosphere.

A $SF_6$ cooling system for ultrasound transducers should therefore preferably be conceived and realized as a closed system in which $SF_6$, being warmed up in the ultrasound transducers, is cooled outside of the transducers before it is pumped through the ultrasound transducers again.

While the invention has been described in detail with respect to specific preferred embodiments thereof, it will be appreciated upon a reading and understanding of the foregoing that numerous variations may be made to those embodiments which nonetheless lie within the scope of the appended claim.

We claim:

1. A method for improving the output of an ultrasonic transducer, for use with a transducer of the type employing at least one piezoelectric element disposed around a central axis of a central fluid pipe having a first open end, an opposite second open end, and a liquid flow path therebetween, such that an alternating voltage applied to the at least one piezoelectric element urges it to vibrate in a radial direction with respect to the central axis to transmit ultrasonic energy into the central fluid pipe, the at least one piezoelectric element further being encased in a fluidum-tight casing, the method comprising the steps of:

- providing the transducer casing with at least one gas inlet and at least one gas outlet;
- providing a gas conducting member in contact with and surrounded by said at least one piezoelectric element, and between said at least one piezoelectric element and a length of said liquid flow path, in such a way that there is a gas flow path connecting the gas conducting member to said gas inlet and to said gas outlet, respectively;
- selecting a cooling gas;
- urging a liquid to flow through said length of said liquid flow oath, said length being surrounded by said at least one piezoelectric element;
- transmitting ultrasonic energy into said length; and
- urging said cooling gas between said at least one piezoelectric element and said liquid flow path by urging said cooling gas through the gas conducting member, thereby cooling the at least one piezoelectric element.

2. The method according to claim 1, wherein said step of selecting a cooling gas includes the step of selecting said gas from the group of gases consisting of: nitrogen, hydrogen, carbon dioxide, Freon 12, ammonia and sulfurhexafluoride $SF_6$.

3. The method according to claim 1, wherein said step of selecting a cooling gas further comprises the step of selecting said cooling gas according to its dielectrical properties in order to suppress arc over within the transducer.

4. The method according to claim 3, wherein said step of selecting a cooling gas of suitable dielectrical properties comprises the step of selecting sulfurhexafluoride ($SF_6$) as said cooling gas.

5. An ultrasonic transducer device, comprising, at least one piezoelectric element, a central fluid conduit having a liquid flow path extending therethrough from a first open end to an opposite second open end, said at least one piezoelectric element surrounding a length of said central fluid conduit and said liquid flow path, said at least one piezoelectric element being structured and arranged for electrical connection to an alternating voltage source applied to opposing surfaces of said at least one piezoelectric element for the purpose of causing said at least one piezoelectric element to change its dimension in response thereto in a radial direction with respect to the central axis of the central fluid conduit to provide ultrasonic energy to any liquid flowing through said length of said liquid flow path surrounded by said at least one piezoelectric element, said at least one piezoelectric element being encased in a gas-tight casing, at least one inlet conduit in the casing for supplying a cooling gas and at least one outlet conduit in the casing for discharging said cooling gas, and a gas conducting member disposed in contact with said at least one piezoelectric element for cooling the at least one piezoelectric element with said cooling gas, said gas conducting member being provided with at least one channel providing a gas flow path through the gas conducting member to allow for the cooling gas to transport heat from the piezoelectric element to the outside of the transducer, said at least one channel being positioned between said at least one piezoelectric element and said length of said central fluid conduit.

6. The ultrasonic transducer device according to claim 5, wherein said gas conducting member includes a metal sleeve, said sleeve comprising said at least one channel, and said sleeve further comprising a bore, said bore comprising said length of said liquid flow path.

7. A method for improving the output of an ultrasonic transducer, for use with an ultrasonic transducer with at least one piezoelectric element circumferentially disposed around a central fluid pipe through which a liquid flows, such that an alternating voltage applied to the at least one piezoelectric element urges the at least one piezoelectric element to vibrate radially with respect to the central fluid pipe to introduce ultrasonic vibrations into the liquid, the method comprising the steps of forming the central fluid pipe from a central sleeve section connected to and disposed between an inlet attachment pipe and an outlet attachment pipe;

providing said central sleeve section with at least one gas conducting channel running in axial direction in a wall of said sleeve;

providing the at least one piezoelectric element circumferentially around said central sleeve section to transfer ultrasonic vibration to the liquid by the sleeve;

urging a liquid to flow through the central sleeve section;

transmitting said ultrasonic vibrations into said liquid; and urging a cooling gas through the at least one gas conducting channel of said central sleeve section for cooling the at least one piezoelectric element.

8. The method according to claim 7, further including the steps of:

providing a thick wall tube circumferentially around the at least one piezoelectric element, said thick wall tube being provided with at least one gas conducting opening running in axial direction through said tube; and urging said cooling gas through the at least one gas conducting opening of said tube for cooling the at least one piezoelectric element.

9. An ultrasonic transducer device comprising at least one piezoelectric element circumferentially disposed around a central fluid pipe for radial vibration in response to an alternating voltage, the central fluid pipe comprising a central sleeve section on an outside of which the at least one piezoelectric element is mounted circumferentially, said sleeve section being provided with at least one gas conducting channel running in axial direction in a wall of said sleeve section for conveying a cooling gas therethrough.

10. The ultrasonic transducer device according to claim 9, comprising a thick wall tube circumferentially disposed around the at least one piezoelectric element, said thick wall tube being provided with at least one gas conducting opening running in axial direction through said tube for conveying a cooling gas therethrough.

* * * * *